United States Patent
Stelzl et al.

(12) 
(10) Patent No.: US 6,555,758 B1
(45) Date of Patent: Apr. 29, 2003

(54) MULTIPLE BLANK FOR ELECTRONIC COMPONENTS SUCH AS SAW COMPONENTS, AND METHOD OF BUILDING UP BUMPS, SOLDER FRAMES, SPACERS AND THE LIKE

(75) Inventors: Alois Stelzl, München (DE); Hans Krüger, München (DE); Karl Weidner, Müchen (DE); Manfred Wossler, München (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/716,339

(22) Filed: Nov. 20, 2000

Related U.S. Application Data

(63) Continuation of application No. PCT/DE99/01315, filed on May 3, 1999.

(30) Foreign Application Priority Data

May 20, 1998 (DE) .......................................... 198 22 794

(51) Int. Cl.[7] .................................................. H05K 1/16
(52) U.S. Cl. ........................ 174/260; 361/777; 361/792
(58) Field of Search ................................. 361/792, 793, 361/794, 795, 777, 729, 780

(56) References Cited

U.S. PATENT DOCUMENTS

| 3,118,016 A | * | 1/1964 | Stephenson |
| 3,334,275 A | * | 8/1967 | Mandeville |
| 3,702,025 A | * | 11/1972 | Archer |

FOREIGN PATENT DOCUMENTS

| DE | 195 43 894 A1 | 9/1996 |
| DE | 195 48 046 A1 | 6/1997 |
| DE | 196 01 388 A1 | 7/1997 |
| EP | 0 637 871 A1 | 2/1995 |
| JP | 07-122838 | 5/1995 |
| JP | 07-321114 | 12/1995 |
| JP | 09-181443 | 7/1997 |

OTHER PUBLICATIONS

International Publication No. WO 97/45955 (Stelzl et al.), dated Dec. 4, 1997.
International Publication No. WO 97/02727 (Mazzoni et al.), dated Jan. 23, 1997.

* cited by examiner

*Primary Examiner*—David L Talbott
*Assistant Examiner*—Jeremy Norris
(74) *Attorney, Agent, or Firm*—Laurence A. Greenberg; Werner H. Stemer; Ralph E. Locher

(57) ABSTRACT

The multiple blank can be diced into individual blanks for electronic components, in particular surface acoustic wave components. Each of the individual blanks is suitable for contact to be made with chips in the flip-chip technique and for contact to be made with the individual blanks in the SMD technique, using external connections. The multiple blank has, for each individual blank, metalized areas which are located on a network which is integrated between layers of the multiple blank and leads to a connecting terminal. Bumps are built up by depositing metal by electroplating on the metalized areas.

6 Claims, 2 Drawing Sheets

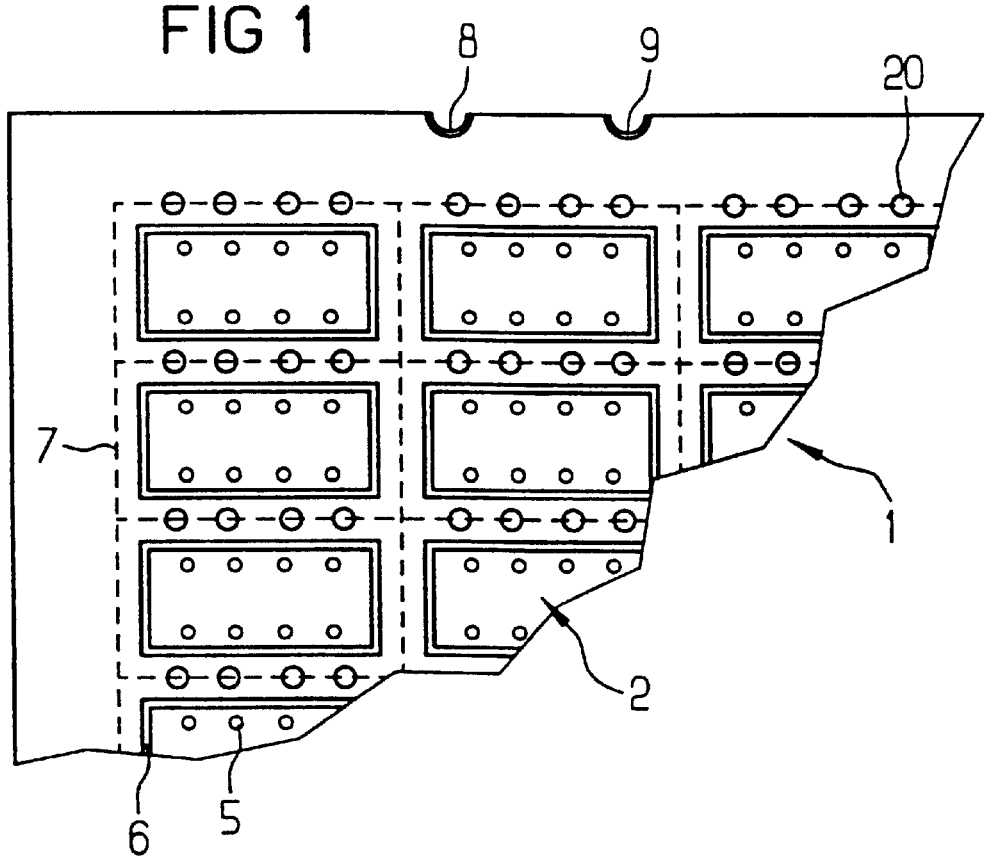
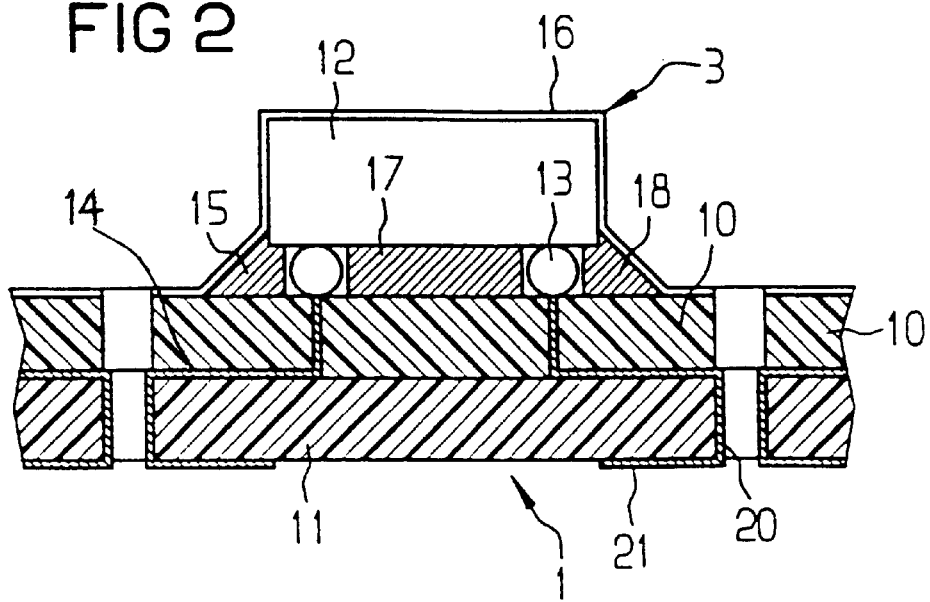

MULTIPLE BLANK FOR ELECTRONIC COMPONENTS SUCH AS SAW COMPONENTS, AND METHOD OF BUILDING UP BUMPS, SOLDER FRAMES, SPACERS AND THE LIKE

CROSS-REFERENCE TO RELATED APPLICATIONS

This is a continuation of copending International Application PCT/DE99/01315, filed May 3, 1999, which designated the United States.

BACKGROUND OF THE INVENTION

FIELD OF THE INVENTION

The invention relates to a multiple blank, which can be separated into individual blanks for electronic components, in particular surface acoustic wave (SAW) components, which are each suitable for contact to be made with chips in the flip-chip technique on the individual blanks and for contact to be made with the individual blanks in the SMD (surface mounted device) technique, using external connections. In addition, the invention relates to a method of building up bumps, solder frames and the like on the multiple blank.

Building up the bumps needed for contact to be made with chips in the flip-chip technique, also referred to as solder balls, and the solder frames needed for fixing the chip metal caps onto ceramic and printed circuit board multiple blanks has hitherto been carried out by means of screen printing or stencil printing.

The prior art method of printing-on bumps and solder frames entails expensive stencils, which are different for each electronic component type, and therefore also type-specific special tools for producing the stencils.

Additional problems in stencil printing occur as a result of distortion of the substrate material, for example of the ceramic of the multiple blank and therefore of the individual blanks, since in all these cases the desired exact geometric arrangement of the bumps on the individual blanks is not possible. This is equally true, although with less damaging effects, of the solder frames and of possible spacers to ensure the necessary spacing between the chip and individual blank or substrate.

SUMMARY OF THE INVENTION

The object of the invention is to provide a multiple blank of the type mentioned above, which overcomes the above-noted deficiencies and disadvantages of the prior art devices and methods of this kind, and which provides a multiple blank that can be separated into individual blanks and which eliminates the disadvantages previously mentioned. The device should be less complicated and permit a method of building up the bumps and solder frames and, if it is necessary, also the spacers and the like which, irrespective of the substrate material of the blank, always exactly ensures the usually type-specific geometry of the bump, solder frame, and the like.

With the above and other objects in view there is provided, in accordance with the invention, a multiple blank assembly, comprising:

a plurality of layers defining a multiple blank separable into individual blanks for electronic components, in particular surface acoustic wave (SAW) components, the individual blanks being configured to be mounted in SMD technique using external connections and to have mounted thereon chips in flip-chip mounting technique;

first and second networks integrated between the layers of the multiple blank and respectively connected to a first connecting terminal and a second connecting terminal;

the multiple blank being formed with first metalized areas for each individual blank for making contact with bumps between the first metalized areas and the chips, the first metalized areas of the multiple blank being interconnected via the first network and to the first connecting terminal; the multiple blank being formed with second metalized areas connected via the second network to the second connecting terminal; and wherein the first and second metalized areas are configured for building up mutually different electronic components from mutually different materials.

In accordance with an added feature of the invention, the connecting terminals of the networks are disposed at a lateral edges, i.e, an end face, of the multiple blank.

In accordance with an additional feature of the invention, the first and second connecting terminals are in contact with each other.

In accordance with another feature of the invention, the multiple blank is a multilayer ceramic multiple blank or a multilayer printed circuit board with dividing faces between the layers, and the networks are disposed at the dividing faces between the layers.

In accordance with a concomitant feature of the invention, a plurality of SMD contact elements that are connected to the first contact areas via plated-through holes are formed in the multiple blank.

With the above and other objects in view there is also provided a production method, which comprises:

providing a multiple blank assembly as detailed in the foregoing text and defining the metalized areas for bumps, solder frames, spacers, and the like; and depositing metallic layers by electroplating on the metalized areas, and thereby connecting up the networks for elements to be produced differently at separate times and depositing different metals.

In accordance with again an added feature of the invention, SnPb alloys are electroplated onto the metalized areas of the multiple blank.

In accordance with again a further feature of the invention, bumps are built up by electroplating SnPb layers onto the first metalized areas of the multiple blank, and subsequently heating the SnPb layers to their melting point.

In accordance with again another feature of the invention, the first metalized areas are predefined by a clear width of the plated-through holes in the multiple blank, and the first metalized areas are enlarged by applying thereon a sequence of layers of metals and subsequently depositing metal layers needed to build up bumps by electroplating and heating the metal layers to their melting point.

In accordance with a preferable feature of the invention, a sequence of layers W—Ni—Au is deposited by screen printing, electroplating, and/or electroless deposition.

In other words, the above objects are satisfied with multiple blanks that have, for each individual blank, metalized areas to make contact with bumps, the areas being located on a network which is integrated in the multiple blank and leads to a connecting terminal.

Further metalized areas for building up solder frames for the metal caps for chips, optionally for spacers and other necessary elements, are in each case located on additional networks which are integrated in the multiple blank and lead to corresponding further connecting terminals.

On the other hand, integrated networks and, consequently their electrical connection to connecting terminals, are dispensed with in all those cases in which conductive areas are not electroplated, that is to say are not intended to be provided with bumps.

By means of these multiple blanks, the metallic layers desired for the bumps, solder frames and the like, for example SnPb layers, can be deposited by electroplating on the metalized areas, the connecting terminals of the individual networks being connected together or activated separately at time intervals, depending on whether identical or different metallic layers, layer compositions and layer thicknesses are required for the bumps, solder frames and the like.

The layer thickness can be set very precisely via the quantity of charge, that is to say the product of current intensity and time. Distortion problems of the type mentioned in the case of stencil printing do not occur. Stencils and the production of corresponding, type-specific special tools for this purpose are likewise dispensed with.

Other features which are considered as characteristic for the invention are set forth in the appended claims.

Although the invention is illustrated and described herein as embodied in a multiple blank for electronic components, in particular surface acoustic wave components, and method of building up bumps, solder frames, spacers and the like on the multiple blank, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partial plan view onto a multiple blank assembly according to the invention;

FIG. 2 is a partial, sectional view taken through an individual blank of FIG. 1, with an electronic component (e.g. a SAW component), with which contact can be made with the individual blank according to the method of the invention in the flip-chip technique and which is fitted with a metal cap;

Identical and functionally equivalent elements are designated with like reference symbols throughout the figures.

DESCRIPTION OF THE PREFERRED EMBODIMENTS

Figure 3:
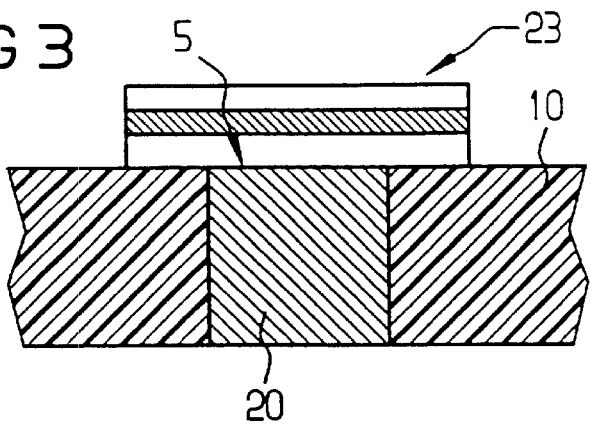
FIGS. 3 to 5 are partial, sectional views showing a sequence in exemplary embodiment in which a bump is built up in accordance with the method of the invention.

Referring now to the figures of the drawing in detail and first, particularly, to FIG. 1 thereof, there is seen a multiple blank 1. The multiple blank 1, by way of example, is a ceramic or printed circuit board blank. The blank 1 is divided into a large number of individual blanks 2 which are arranged in rows and columns and which can each be separated (i.e., diced) along a dividing line 7 indicated by a dashed line. Depending on the desired, exact geometric arrangement of the solder frames 15 and the bumps 13, which in each case depends on the component type (see FIG. 2), each individual blank 2 has metalized areas 5, 6, some of which are applied by a screen printing technique—see the areas 6 for the solder frames 15—and some of which are end faces of plated-through holes 20.

With reference to FIG. 2, the multiple blank 1 itself comprises two layers 10, 11, for example of ceramic or printed circuit boards. Preferably arranged in the area between the interfaces of these layers are parts of one or more networks 14, in each case separated from one another, which on one side each lead to connecting terminals 8 and 9 and on the other side lead to the metalized areas 5 for bumps or areas 6 for solder frames.

When the multiple blank 1 is separated into the individual blanks 2 along the dividing line 7, which is carried out following the build-up of the bumps 13 and the solder frames 15 by electroplating and ultimately after the provision of the end product 3 according to FIG. 2, the networks 14, which are conventionally configured, are likewise divided up. In this way, inter alia, the contacts initially provided between the individual metalized areas 5 of each individual blank 2 are interrupted.

As shown by FIGS. 1 and 2, the dividing line 7 is preferably chosen in such a way that, when the multiple blank 1 is separated into its individual blanks 2, the plated-through holes 20, which connect the SMD contact elements 21 to the metalized areas 5 or to the bumps 13 applied by electroplating, are divided up in the area of the layer 11 of the multiple blank 1 into two through-plated holes. Each of the two through-plated holes is then associated with a respectively adjacent individual blank 2.

The end product 3 which is illustrated in FIG. 2 and which is produced in accordance with the method that will be explained in the following, has a chip 12, for example a piezoelectric substrate which, by means of the bumps 13 of its active electric structures, make contact with SMD contact elements 21. The chip 12 per se is protected by a metal cap 16, which is soldered onto the solder frame 15 applied by electroplating. In addition, a covering or protective layer 17, referred to by the assignee (Siemens Matsushita Components of Germany) under the name PROTEC, is provided between the chip 12 and the blank, and the free space between the covering layer 17 and the metal cap 16 is filled, for example with epoxy resin 18.

The application proposed by the invention of the electroplating method for depositing the metal layer onto the metalized areas 5, 6 provided for this purpose is distinguished by numerous advantages.

For example, the layer thickness can be set precisely via the quantity of charge, that is to say via the exactly controllable product of current intensity and time. Depending on the layer structure and the layer composition, that is to say, for example, depending on the desired identical or different layer composition for the solder frames 15 and the bumps 13, the networks 14 can be connected together at the same time or connected up at separate times via their connecting terminals 8, 9.

The latter is recommended, for example, in the case of the deposition by electroplating of metal layers for solder frames 15, for example SnPb layers, onto the metalized areas 6, since for the SnPb layers of the solder frame 15, a melting point is required which is higher than that of the bumps 13.

The method chosen moreover permits different metals, for example SnPb, to be deposited on one another by electroplating in a sequence, which is advantageous in all cases in which the layer cannot be deposited as an alloy and consequently the latter is obtained only when the metals applied are melted.

Figure 4:
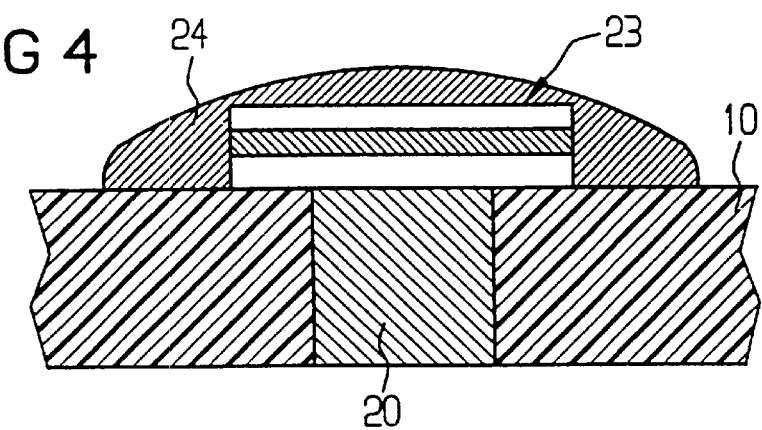
Figure 5:
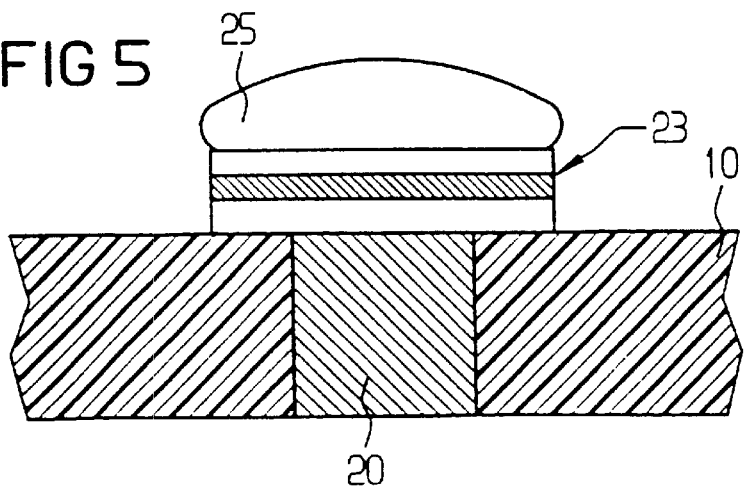

If the metalized area 5 provided to make contact with the bumps 13 and predefined by the clear width of the plated-through hole 20 in the layer 10 of the multiple blank 1 is not adequate for the required bump sizes, it is recommended to proceed in accordance with the steps indicated in FIGS. 3 to 5. In this case, first of all a sequence of layers 23 is applied. The layers 23 may, for example, comprise a sequence of layers W—Ni—Au and may be deposited partly using screen printing technology, electroplating, or electroless deposition. The metalized area 5 is thereby enlarged. Then, the metal layers 24 required to build up bumps are deposited by electroplating and heated to their melting point, which leads to the bump balls 25 of relatively larger diameter (see FIG. 5).

We claim:

1. A multiple blank assembly, comprising:

a plurality of layers defining a multiple blank separable into individual blanks for electronic components, the individual blanks being configured to be mounted in SMD technique using external connections and to have mounted thereon chips in flip-chip mounting technique;

first and second networks integrated between said layers of said multiple blank and respectively connected to a first connecting terminal and a second connecting terminal;

said multiple blank being formed with first metalized areas for each individual blank for making contact with bumps between said first metalized areas and the chips, said first metalized areas of said multiple blank being interconnected via said first network and to said first connecting terminal;

a plurality of SMD contact elements connected to said first contact areas via plated-through holes formed in said multiple blank; and said multiple blank being formed with second metalized areas connected via said second network to said second connecting terminal.

2. The multiple blank assembly according to claim 1, wherein said multiple blank is separable into individual blanks for mounting surface acoustic wave components.

3. The multiple blank assembly according to claim 1, wherein said multiple blank is formed with lateral edges and said connecting terminals of said networks are disposed at said lateral edges.

4. The multiple blank assembly according to claim 1, wherein said first and second connecting terminals are in contact with each other.

5. The multiple blank assembly according to claim 1, wherein said multiple blank is a multilayer ceramic multiple blank with dividing faces between said layers, and said networks are disposed at said dividing faces between said layers.

6. The multiple blank assembly according to claim 1, wherein said multiple blank is a multilayer printed circuit board with dividing faces between said layers, and said networks are disposed at said dividing faces between said layers.

* * * * *